(12) United States Patent
Gu et al.

(10) Patent No.: US 6,972,840 B1
(45) Date of Patent: Dec. 6, 2005

(54) METHOD OF REDUCING PROCESS PLASMA DAMAGE USING OPTICAL SPECTROSCOPY

(75) Inventors: Shiqun Gu, Vancouver, WA (US); Peter Gerard McGrath, Portland, OR (US); Ryan Tadashi Fujimoto, Gresham, OR (US)

(73) Assignee: LSI Logic Corporation, Milpitas, CA (US)

( * ) Notice: Subject to any disclaimer, the term of this patent is extended or adjusted under 35 U.S.C. 154(b) by 69 days.

(21) Appl. No.: 10/680,503

(22) Filed: Oct. 6, 2003

Related U.S. Application Data

(62) Division of application No. 10/195,775, filed on Jul. 12, 2002, now Pat. No. 6,673,200.

(60) Provisional application No. 60/384,499, filed on May 30, 2002.

(51) Int. Cl.[7] .............................................. G01N 21/00
(52) U.S. Cl. ..................... 356/337; 356/337; 356/342; 257/48; 257/80; 257/98

(58) Field of Search .............................. 257/80, 98, 48; 356/336, 337, 342

(56) References Cited

U.S. PATENT DOCUMENTS

| 6,566,272 B2 * | 5/2003 | Paterson et al. |
| 6,673,200 B1 * | 1/2004 | Gu et al. |
| 6,778,272 B2 * | 8/2004 | Nakano et al. ............. 356/336 |

* cited by examiner

*Primary Examiner*—Fetsum Abraham
(74) *Attorney, Agent, or Firm*—Beyer Weaver & Thomas, LLP

(57) ABSTRACT

Optical emission spectra from a test wafer during a plasma process are measured using a spectrometer. The plasma charging voltage retained by (detected by) the test wafer is measured after the process step is completed. The emission spectra are correlated with the plasma charging voltage to identify the species contributing to the plasma charging voltage. The optical emission spectra are monitored in real time to optimize the plasma process to prevent plasma charging damage. The optical emission spectra are also monitored to control the plasma process drift.

8 Claims, 5 Drawing Sheets

METHOD OF REDUCING PROCESS PLASMA DAMAGE USING OPTICAL SPECTROSCOPY

CROSS-REFERENCE TO RELATED APPLICATION

This is a Divisional application of prior application Ser. No. 10/195,775 filed on Jul. 12, 2002, now U.S. Pat. No. 6,673,200.

This application takes priority under U.S.C. 119(e) of U.S. Provisional Application No. 60/384,499 filed May 30, 2002 entitled, "METHOD OF REDUCING PROCESS PLASMA DAMAGE USING OPTICAL SPECTROSCOPY" by Shiqun Gu, Peter McGrath, and Ryan Fujimoto, which is incorporated by reference in its entirety for all purposes.

BACKGROUND OF THE INVENTION

1. Field of the Invention

The present invention relates to processes for monitoring plasma charging in semiconductor wafers. More particularly, the present invention relates to the use of optical emission spectroscopy in plasma etching and deposition processes.

2. Description of the Related Art

Semiconductor wafer fabrication involves a series of processes used to create semiconductor devices and integrated circuits (ICs) in and on a semiconductor wafer surface. Fabrication typically involves the basic operations of layering and patterning, together with others such as doping, and heat treatments. Layering is an operation used to add thin layers of material (typically insulator, semiconductor or conductor) to the surface of the semiconductor wafer. Patterning is an operation that is used to remove specific portions of the top layer or layers on the wafer surface. Patterning is usually accomplished through the use of photolithography (also known as photomasking) to transfer the semiconductor design to the wafer surface.

In the wafer fabrication, plasma enhanced chemical vapor (PECVD) deposition and plasma etching are used respectively to deposit thin films and etch patterned wafers. During these plasma processes, metal lines (acting like an antenna structure) can collect charge from the plasma and transfer the charge to poly gates via metal interconnects. If the plasma charge voltage is high, such as, for example, exceeding 6 volts, the charge accumulated on the poly gates can damage the gate oxide. This results in a weak gate oxide and induces high leakage. Therefore continuous monitoring and reduction in plasma charging is critical for device manufacturing.

Conventional approaches to the monitoring of plasma charging include the use of wafer level reliability wafers (WLR) or EPROM wafers. In one approach, the wafer level reliability (WLR) wafers are processed through the production line. The WLR wafer has various types of metal antenna structures, which mimic those typically used in a manufacturing site. The wafers are tested upon fabrication completion, and the quality of gate oxide can be tested by measuring the charge breakdown voltage (QBD). Alternatively, the plasma charge can be tested by the threshold voltage ($V_t$) shift. But testing using WLR wafers to identify plasma charging damage is exceeding slow, sometimes taking several weeks or months to receive the data feedback. Moreover, the results depend on the quality of the gate oxide. Finally, results from individual plasma process steps interact with other plasma process steps, making it difficult to isolate the damage caused by a particular plasma operation.

Similarly, the EPROM wafer testing is a slow process, typically taking several days to yield useful data. EPROM test wafers EPROM wafers are also very expensive, the cost further increasing due to the test wafer's susceptibility to plasma damage and the resulting need for frequent replacement EPROM test wafers.

Accordingly, it is desirable to provide a more effective method and apparatus for monitoring and reducing plasma charge damage.

SUMMARY OF THE INVENTION

To achieve the foregoing, the present invention provides methods and apparatus for determining plasma charge voltages and correlating plasma damage using optical emission spectra. The present invention provides an improved process for determining species contributing to plasma charging damage and using optical emission spectra for those species to optimize the plasma process or to control the plasma process. The present invention also provides an apparatus to monitor process variations using optical emission spectra. Selected optical emission peaks, such as determined using optical emission spectrometry techniques, correlate with plasma charging. These peaks may be measured in real time to optimize the plasma process to avoid plasma processing damage. Alternatively, the emission peaks may be used to monitor the plasma process drift to match a plasma process in one chamber with the same process in a different chamber.

In one embodiment, the present invention provides a method for determining process species associated with plasma charging damage. Optical emission spectra from a test wafer are measured. The plasma charging voltage detected by the test wafer is measured. The emission spectra are correlated with the plasma charging voltage to identify the species contributing to the plasma charging voltage.

In another embodiment, the present invention provides a method for adjusting plasma process parameters by monitoring the optical emission spectral output. A first optical emission spectrum correlated with plasma charging is measured. A plasma process parameter is adjusted in response to the measured first optical emission spectrum. In one embodiment, the first optical emission spectrum is measured also after the adjustment of the process parameter.

These and other features and advantages of the present invention are described below with reference to the drawings.

DETAILED DESCRIPTION OF PREFERRED EMBODIMENTS

Reference will now be made in detail to preferred embodiments of the invention. Examples of the preferred embodiments are illustrated in the accompanying drawings. While the invention will be described in conjunction with these preferred embodiments, it will be understood that it is not intended to limit the invention to such preferred embodiments. On the contrary, it is intended to cover alternatives, modifications, and equivalents as may be included within the spirit and scope of the invention as defined by the appended claims. In the following description, numerous specific details are set forth in order to provide a thorough understanding of the present invention. The present invention may be practiced without some or all of these specific details. In other instances, well known process operations have not been described in detail in order not to unnecessarily obscure the present invention.

The present invention provides in one embodiment an improved process for determining species contributing to plasma charging damage and in another embodiment an apparatus to monitor process variations using optical emission spectra. Selected optical emission peaks, such as determined using optical emission spectrometry techniques correlate with plasma charging. These peaks may be measured in real time to optimize the plasma process to avoid plasma processing damage. Alternatively, the emission peaks may be used to monitor the plasma process drift or to match a plasma process in one chamber with the same process in a different chamber.

Figure 1:
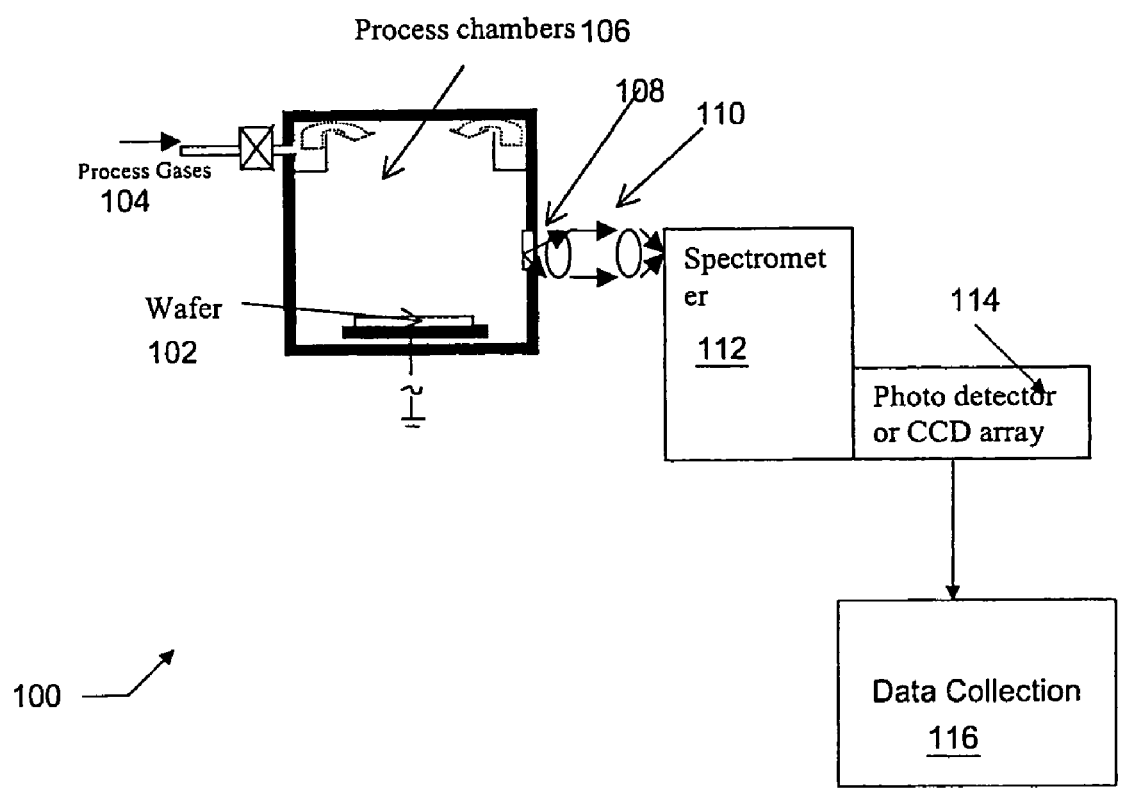
FIG. 1 is a diagram illustrating a plasma chamber optical spectroscopy system to measure and analyze plasma emissions from a process chamber in accordance with one embodiment of the present invention.

FIG. 1 is a diagram illustrating a plasma charge measuring apparatus to measure plasma emissions from a process chamber in accordance with one embodiment of the present invention. The plasma charge measuring apparatus 100 includes a process chamber 106 for performing a plasma process operation, such as plasma enhanced chemical vapor deposition (PECVD) or plasma etching. The plasma chamber or reactor may be any suitable plasma chamber for performing plasma deposition or etching, as are known to those of skill in the art, such as including many commercially available models. For example, the LAM XLE Pad Etcher, manufactured by Lam Research Corporation, Fremont, Calif.; the Applied Materials 5300 Centura etching chamber, manufactured by Applied Materials, Corp., Santa Clara, Calif.; and the ULVAC Asher, manufactured by ULVAC Japan Ltd. are three examples of the many suitable plasma process chambers for use with the present invention. Typically, the process chamber in the commercially available devices is constructed from stainless steel or aluminum materials, although other materials are believed to be suitable.

The wafer 102 is typically loaded and placed onto the bottom portion of the process chamber 106 and supported by a substrate holder. Commercially available plasma chambers range from manually loaded systems, such as single wafer hand loaded systems, to automatically loaded systems. The plasma is typically generated by applying an RF power through electrodes within the process chamber 106, one electrode forming a cathode and another electrode forming an anode. When a gas is subjected to a DC or RF potential between the electrodes at reduced pressures, it produces a glow discharge and dissociates. This glow is due to the electronically excited species producing optical emissions, the optical emissions characterized by the specific composition of the plasma discharge gas. The dissociated molecules more readily react with the layers on the wafer, thus reducing the time required for processing.

The process gases 104 are typically introduced into the process chamber 106 through a valved inlet line. The process gases 104, i.e., plasma feed gases, vary according to the deposition or etch process steps involved. For example, the process gases 104 may include any one or more of the following gases: $CHF_3$, $SF_6$, $O_2$, HBr, Cl, $NF_3$, and $CF_4$. As a further particular example, the fluorinated plasma process gases are typically used for the etching or ashing of oxide layers. The recitation of the example process gases is intended to be illustrative and not limiting. The scope of the present invention is intended to be extended to each variety or combination of process gases as may be used in plasma process chambers by those of skill in the relevant art.

The process chamber also includes a viewport 108, for spectroscopic analysis of the optical emissions. Viewports are typically used to view the deposition or etch process occurring inside the process chamber 106. In specific embodiments of the invention, an optical coupling link 110 couples the viewport to an optical spectrometer 112 for analysis of the optical emissions. Methods of coupling viewports to spectrometers are known in the industry. For example, an optical fiber cable may be used to connect the viewport to the spectrometer.

The spectrometer 112 enables real time monitoring of the plasma process steps by performing optical emission spectrometry. The optical spectrometer functions to resolve the optical emissions received from the viewport into constituent wavelengths. Particular molecular species may be uniquely characterized by one or more unique optical emission spectral peaks. It is expected that the relevant information for the plasma processes and plasma charge monitoring will be contained in the 200 to 900 nm wavelength range, although the invention is not so limited.

After dispersing the optical emissions from the plasma gases within the process chamber 106 to spectral components, the information is stored on an image sensor 114, typically comprising either a photodetector or CCD array. Each of these stores data in different ways. For example, a grating with multiple slits may be used to control the projection of the spectrum of output light beams from the optical spectrometer 112 onto the multiple elements of a photodiode sensor array, such as an array in the image sensor 114. That is, the spectrometer splits the optical emissions from the viewport into its full spectrum and the grating enables the different spectral elements from the spectrum to be projected onto different parts of the CCD array.

In an alternative embodiment, a single slit may be rotated in conjunction with a photodetector to record the intensities of the individual frequencies included in the spectral content. Using either of these image sensing and storage methods, the spectral content may be acquired in a very short time period, typically less than one minute.

The optical emission spectrometry data acquired is then stored and analyzed in data collection unit 116. Various embodiments of the method of the present invention may implement the data collection unit, in whole or in part, on a computing apparatus. Useful machines for performing the operations of this invention include general purpose digital computers or other data processing devices. Such apparatus may be specially constructed for the required purposes, such as for example, integrated circuits and microprocessors designed specifically to perform the function, or it may be a general purpose computer selectively activated or reconfigured by a computer program stored in the computer. The data collection unit is configured, in accordance with one embodiment, to determine a process species associated with plasma charging, as illustrated in and described with reference to FIG. 3 below. The data collection unit is configured, in accordance with one embodiment, to adjust process parameters using optical emission spectral output as illustrated and described further below with reference to FIG. 4. In yet another embodiment, the data collection unit is configured to further monitoring process variations by monitoring the spectral output as illustrated and described further with reference to FIG. 5.

In order to correlate emission peaks to plasma charge or to perform process optimization, test wafers are used to measure the plasma charge. As described earlier, wafer level reliability (WLR) wafers are used in conventional semiconductor processing to detect process changes that could adversely affect the product lifetime. This includes damage caused by plasma charging. Alternatively, EPROM wafers are Used for these same purposes. According to one embodiment of the present invention, the wafer 102 in two or more plasma process runs is either a WLR wafer or an PROM test wafer and is used to develop a correlation database. That is, plasma damage charge as measured on a test wafer is correlated with optical emission peaks as measured by an optical spectrometer 112. According to another embodiment, the process is optimized by manipulating process parameters and observing the plasma charging effects (as determined using the optical emissions measured by the optical spectrometer 112 and correlating the measurements to plasma charging).

Since the use of optical emission spectrometry is non-invasive to the plasma processes and further provides real time data, variations in the monitored plasma process may be effectuated without the delays associated with conventional plasma charging such as through sole reliance on test wafers, such as WLR wafers or EPROM wafers.

Figure 2:
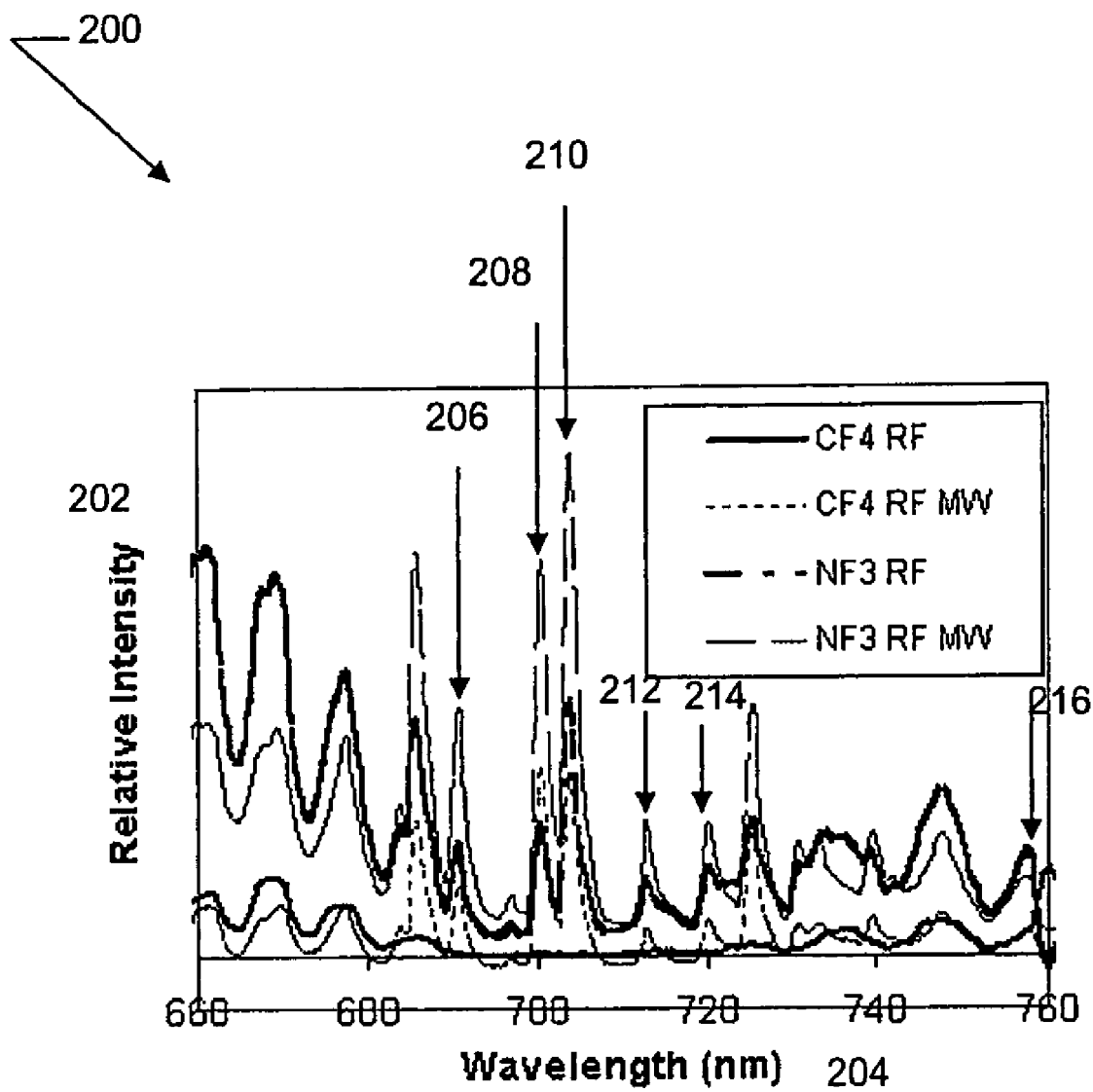
FIG. 2 is an example graphical representation of relative intensity as a function of wavelength from a spectrometer in accordance with one embodiment of the present invention.

FIG. 2 is an example graphical representation of relative intensity as a function of wavelength from a spectrometer in accordance with one embodiment of the present invention. The optical emission spectrum graphical representation 200 illustrates chemical species associated with increased plasma charge, as detected by a system such as that illustrated in FIG. 1. For example, the free F emission spectral peaks identified, i.e., peaks 206, 208, 210, 212, 214, and 216, correlate to a high plasma charge detected by a test wafer. Thus, a data collection unit, such as illustrated and described with reference to FIG. 1, may correlate the intensities of such spectral peaks, according to one embodiment, with plasma charge, as measured on the test wafer. While not wishing to be bound by a particular theory, it is believed that plasma charge damage is a combination of RF and free F density in the plasma (when fluorine is used as a process species). The plasma charge voltage, for example as detected by test wafers manufactured by Wafer Charging Monitors, Inc., Woodside, Calif., was observed to increase monotonically with the free F emission peak intensity detected by optical spectroscopy in the plasma process chamber 200. That is, the recipes which showed high plasma charge on WLR wafers also exhibited high free F emission on optical spectra.

Thus, optical spectroscopy may be used to identify emission peaks correlated to plasma charge. In order to measure the plasma charge, test wafers are used, as conventionally known in the relevant art. While fluorine species have been described as having OES peaks that correlate to plasma charging, the invention is not so limited. The invention is intended to extend to all process species having peaks which correlate to plasma charging.

Figure 3:
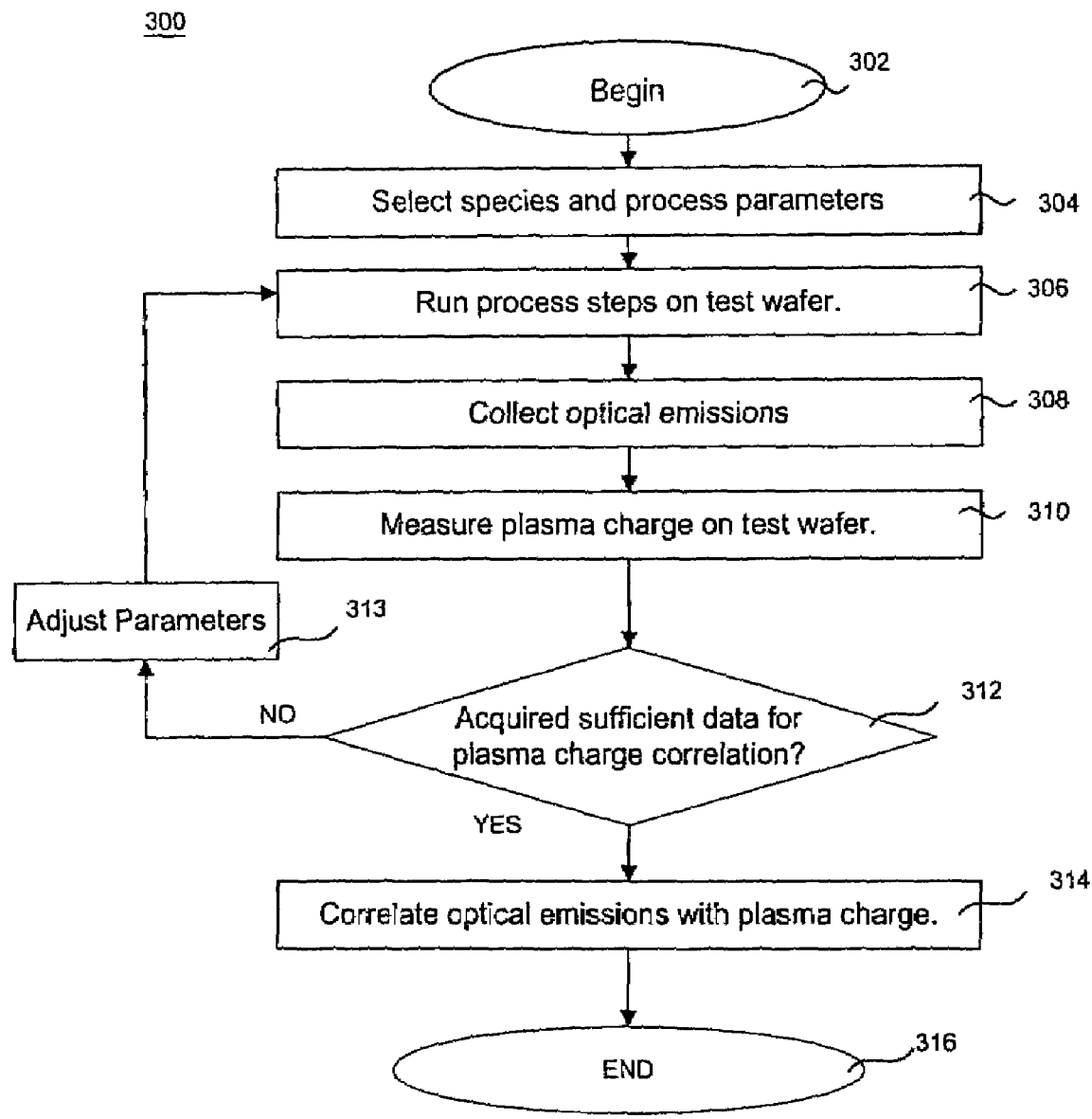
FIG. 3 is a flowchart illustrating a method for determining a process species associated with plasma charging in accordance with one embodiment of the present invention.

FIG. 3 is a flowchart illustrating a method for determining a process species associated with plasma charging in accordance with one embodiment of the present invention. The method for determining a process species associated with plasma charging begins at an operation 302. Next, process species and process parameters are selected in an operation 304. While not wishing to be bound by any theory, the amount of plasma charging is believed to be process dependent. That is, the plasma charging that may be measured, for example, on a test wafer, may vary according to the levels of a variety of process parameters. These process parameters include, but are not limited to, pressures in the plasma chamber, process species flow rates, process species (i.e. the gases constituting the process gases), and RF levels. For example, and in accordance with one embodiment, the species and process parameters are selected in accordance with known general process recipes for deposition or etching using specified process gases.

Next, in an operation 306, the plasma process steps are run on the test wafer. The test wafer may comprise any suitable test wafer, including for example, EPROM test wafers, such as CHARM wafers manufactured by Wafer Charging Monitors, Inc. or WLR wafers which are processed in the manufacturing plant. In the CHARM wafers, metal antennas collect plasma charge and store it in EPROM gates. The charge develops a voltage across the gate and substrate capacitor, which changes the $V_t$ of the EPROM transistor.

In operation 308, optical emissions from the plasma are collected. Optical emissions are generated by the plasma and collected by the spectrometer concurrent with the running of the process steps in operation 306. As noted above, each molecular species in the [plasma may be characterized by unique emission spectra. As described with reference to FIG. 1, the optical emissions are collected in one embodiment by an optical spectrometer optically linked to a viewport in the plasma process chamber.

In a next operation 310, plasma charge is measured on the test wafer after completion of process operations. Techniques in determining the plasma charge detected by the test wafer vary with the wafers. For example, the EPROM test wafers collect the plasma charge and store it on the EPROM gate, which shifts the threshold voltage ($V_t$). After measurement of the $V_t$ shift, the plasma charge voltage and current can be detected. Since EPROM test wafers require the process steps to be completed before measuring the threshold voltage, correlation of the plasma charging to optical emission spectrometry measurements are not made in real time. For example, the plasma charge measurements may not be available until a day after the commencement of the processing steps. Moreover, when other test wafers such as WLR wafers are used in the correlation setup process, plasma charge measurements may not be available for a week or longer.

If insufficient data is obtained to correlate plasma charging with optical emission spectra, the process parameters are adjusted in an operation 313 and operations 306–310 are repeated on a test wafer. That is, process steps are run on a test wafer, optical emissions collected and plasma charging determined for the new process conditions. The process parameters that may be adjusted in step 313 are extensive, and include, for example, any of the following: process species gas flow, chamber pressure, chamber geometry, RF power level, and process temperatures. These process parameter examples are illustrative only and not intended to be limiting.

After sufficient data for plasma charge correlation is obtained, the optical emission data is correlated with the plasma charge in an operation 314. This requires at least comparison of emission spectra at two conditions, plasma charging and no charging, as detected by the WLR or EPROM test wafers. Comparison of the emission spectra at more than 2 conditions will enable better correlation between the plasma charging and the OES measurements. Correlation may be performed using suitable software algorithms such as may be implemented on general or special purpose computers in ways known to those of skill in the relevant art, and will therefore not be described further here. For example, hardware and software systems to facilitate correlating emission spectra are commercially available, such as including one available from Ocean Optics, Inc., of Dunedin, Fla.

With the correlation data as described, the intensity of the identified emission spectra may be measured and used to optimize the plasma process to avoid plasma charging damage or alternatively to monitor the plasma charging in real time, as described further below with reference to FIGS. 4 and 5.

Figure 4:
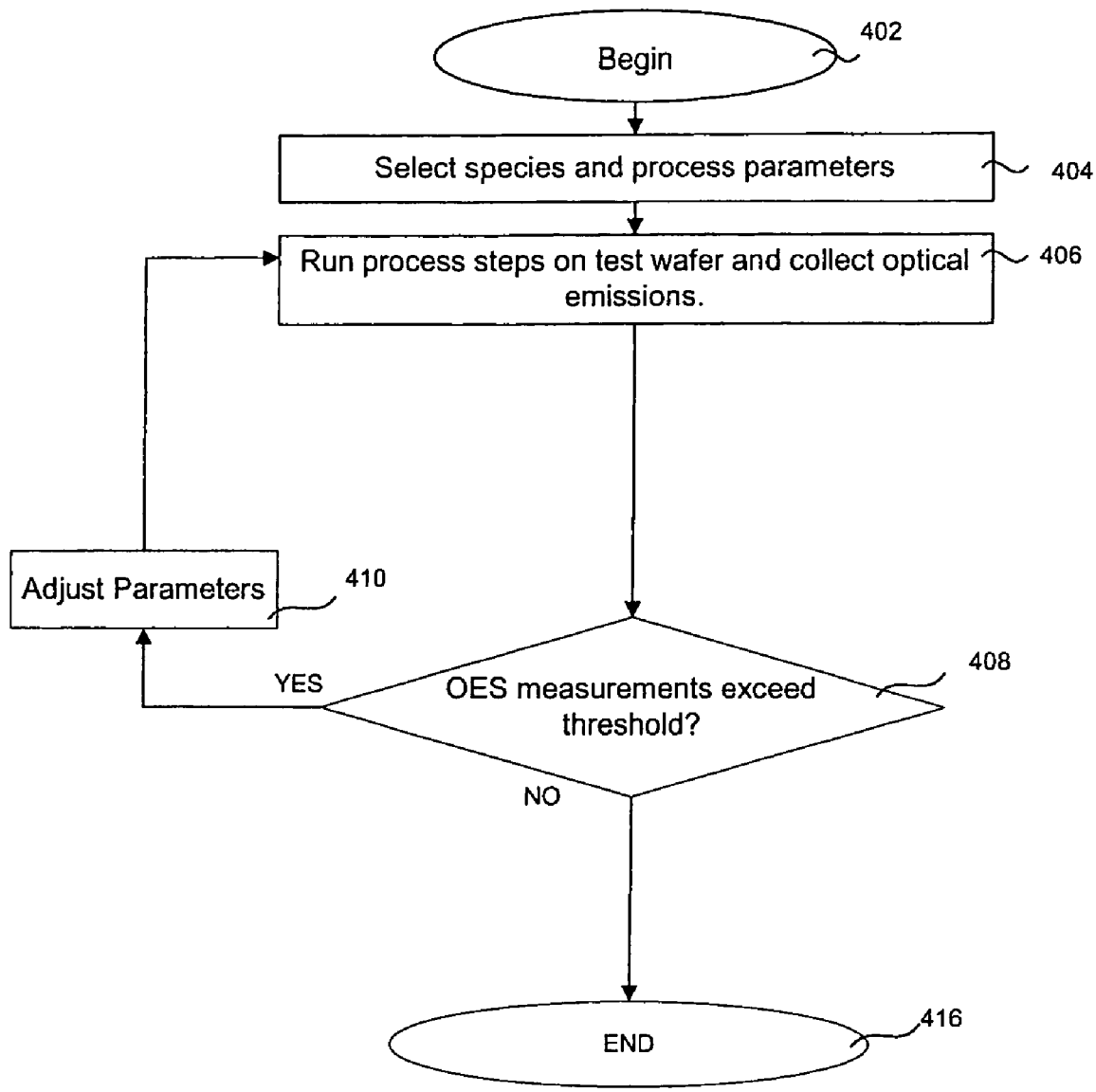
FIG. 4 is a flowchart illustrating a method for adjusting process parameters using optical spectral output in accordance with another embodiment of the present invention.

FIG. 4 is a flowchart illustrating a method for adjusting process parameters using optical spectral output in accordance with another embodiment of the present invention. The process begins in an operation 402. Species and process parameters are selected in an operation 404. Next, in operation 406, process steps are run on a wafer and optical emissions are collected. The wafer may be any production wafer. In one embodiment, the wafer is a test wafer, such as for example, an EPROM wafer or a WLR wafer as described in greater detail above, to enable verification of the plasma charging. As described with reference to FIG. 1, the optical emissions are collected in one embodiment by an optical spectrometer optically linked to a viewport in the plasma process chamber. The plasma process parameters are adjusted, according to one embodiment, to reduce plasma charging damage to the wafer, such as may occur to gate oxides.

Thereafter, a determination is made in an operation 408 as to whether the optical emissions, for example at the identified spectral peaks (selected frequencies), exceed a predetermined threshold. The predetermined threshold is determined from correlation data correlating spectral peaks with plasma charging, such as developed and described by the methods illustrated in FIG. 3. If the identified spectral peaks exceed the threshold, process parameters are adjusted in an operation 410, and operations 406–408 are repeated until the plasma charging is reduced or the process is optimized. For example, for F based chemistries, the intensities of free F peaks such as illustrated in FIG. 2 at 691, 704, 713, 720, and 757 nm are monitored and the process parameters adjusted so that the emission intensities of free F is minimized. The method ends at an operation 416 with the process optimized.

Figure 5:
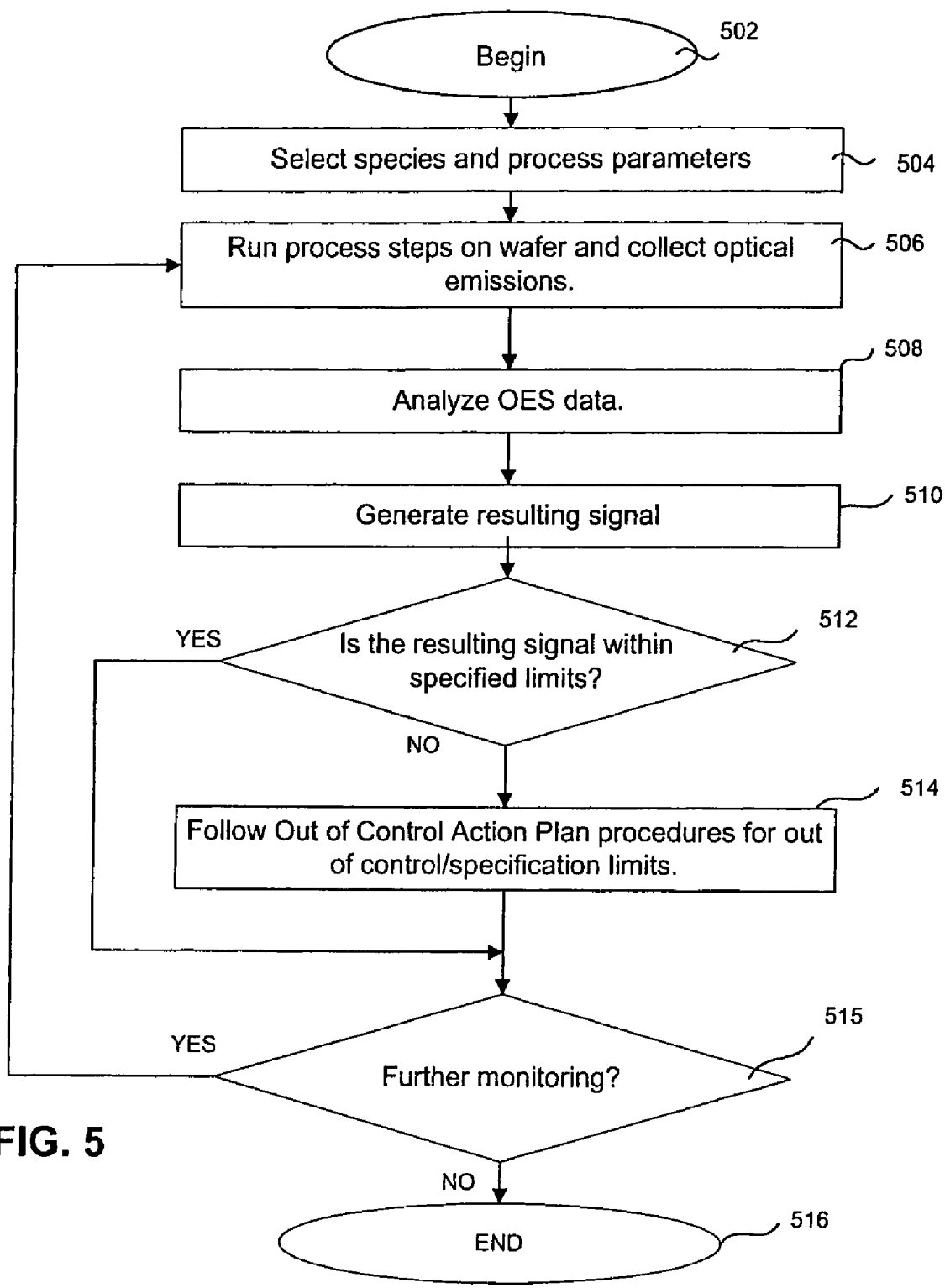
FIG. 5 is a flowchart illustrating a method for monitoring process variations in accordance with another embodiment of the present invention.

FIG. 5 is a flowchart illustrating a method for monitoring process variations in accordance with another embodiment of the present invention. The process begins in an operation 502. In an operation 504, the species and process parameters are selected as in operation 404 illustrated and described with reference to FIG. 4. Plasma process steps are then run on the wafer and emission data is collected in an operation 506, similar to that described with reference to operation 406 in FIG. 4. Next, in an operation 508, the optical emission spectroscopic data is analyzed. In one embodiment, the optical emissions are detected by an optical spectrometer, sensed by a CCD array, and then stored in a coupled data collection unit, such as a general purpose computer suitably configured. The data collection unit identifies the emissions peaks which are correlated to plasma charging and then uses the identified peaks to monitor the plasma charging.

Correlation data previously accumulated, such as by using the methods described with reference to FIG. 3, enable the data collection unit to determine the plasma charging levels in real time by monitoring optical emission spectra. Next, in an operation 510, a resulting signal is generated, based on the evaluated optical emission measurements. The resulting signal is preferably the intensity level as a function of time of one or more wavelengths which have been correlated with plasma charging.

The resulting signal is next compared in an operation 512 with a predetermined signal to determine to determine if the process has drifted, or in an alternative embodiment, whether the level from the chamber exceeds the levels from a baseline chamber. Preferably, if the measurements are outside of a predetermined limit, the operator follows an out of control action procedure in a next operation 514 which in one embodiment involves shutting down the process to make adjustments in order to control the process drift. The out of control action plan procedures may include, for example, manual or automatic signals for adjustment of process parameters or alternatively may include advisory signals or any appropriate signal based on the measure of divergence of spectral values (i.e., the measured intensity levels) from predetermined values. The procedures preferably include a shut down of the process to make process adjustments or alternatively, in other embodiments, provide for adjustments of the process without shutting down.

If measurements are to continue as determined in operation 515, operations 504–514 are repeated until, for example, the process ends. In an alternative embodiment, monitoring of the optical emission spectra may be used for chamber matching. Plasma process chambers vary in geometries and in other structural aspects that may affect plasma charging and other operational characteristics. In order to match the process in one chamber to another, the monitoring of the optical emission spectra may be used in a similar manner as described above with reference to FIG. 5. In such a situation, the out of control plan procedures, as identified in operation 514, including either shutting down the process or performing adjustment to the process (without shutting down) to bring the resulting signal level from the second chamber within specified limits, such as, for example, those corresponding to a baseline levels from a first chamber.

The processes presented herein are not inherently related to any particular computer or other apparatus. In particular, various general purpose machines may be used with programs written in accordance with the teachings herein, or it may be more convenient to construct a more specialized apparatus to perform the required method steps. The required structure for a variety of these machines will appear from the description given above.

As noted earlier, the conventional plasma charging monitoring methods presents several problems. Using WLR wafers or EPROM test wafers to measure the plasma charging is expensive and imposes delays between the process runs and the generation of measurements. With the methods and apparatus of the present invention as described above, real time data may be provided to optimize the plasma process or alternatively for process monitoring or chamber matching. Moreover, monitoring optical emission spectroscopic data is non-destructive, thereby reducing test wafer expenditures.

Although the foregoing invention has been described in some detail for purposes of clarity of understanding, it will be apparent that certain changes and modifications may be practiced within the scope of the appended claims. Accordingly, the present embodiments are to be considered as illustrative and not restrictive, and the invention is not to be limited to the details given herein, but may be modified within the scope and equivalents of the appended claims.

What is claimed is:

1. An apparatus for monitoring plasma process parameters to avoid plasma damage, the apparatus comprising:
   a plasma chamber;
   a spectrometer for determining optical emissions from the plasma chamber wherein the spectrometer includes a multiple slit diffraction grating that enables light produced by plasma of the chamber to be split into various spectral components and that are directed onto various associated portions of a sensor array which generates electrical signals that correspond to an optical emission spectrum for the plasma in the chamber; and
   a processor configured to correlate the optical emission spectrum with plasma charging values on the wafer.

2. The apparatus recited in claim 1 wherein the plasma chamber has a viewport for collecting optical emissions.

3. The apparatus recited in claim 1 wherein comprising an optical fiber guiding optical emissions from the plasma chamber to the spectrometer.

4. The apparatus recited in clam 1 wherein the processor is further configured to adjust the plasma process parameters in response to a comparison between the measured optical emissions and data correlating optical emissions with plasma charging.

5. The apparatus recited in claim 1 wherein the processor is further configured to adjust the plasma process parameters in response to a comparison between the measured optical emissions and data correlating optical emissions with plasma charging.

6. An apparatus for monitoring plasma process parameters to avoid plasma damage, the apparatus comprising:
   a plasma chamber;
   a spectrometer for determining optical emissions from the plasma chamber wherein the spectrometer includes a rotatable single slit diffraction grating that when rotated enables different spectra frequencies of light produced by plasma of the chamber to be directed onto various associated portions of a sensor array which generates electrical signals that correspond to an optical emission spectrum for the plasma in the chamber; and
   a processor configured to correlate the optical emission spectrum with plasma charging values on the wafer.

7. The apparatus recited in claim 6 wherein the plasma chamber has a viewport for collecting optical emissions.

8. The apparatus recited in claim 6 further comprising an optical fiber guiding optical emissions from the plasma chamber to the spectrometer.

* * * * *